(12) United States Patent
Pensala et al.

(10) Patent No.: US 8,916,942 B2
(45) Date of Patent: Dec. 23, 2014

(54) MICROELECTROMECHANICAL RESONATOR AND A METHOD FOR PRODUCING THE SAME

(75) Inventors: Tuomas Pensala, Helsinki (FI); Antti Jaakkola, Espoo (FI)

(73) Assignee: Valtion Teknillinen Tutkimuskeskus, Espoo (FI)

( * ) Notice: Subject to any disclaimer, the term of this patent is extended or adjusted under 35 U.S.C. 154(b) by 718 days.

(21) Appl. No.: 12/779,104

(22) Filed: May 13, 2010

(65) Prior Publication Data

US 2011/0279201 A1 Nov. 17, 2011

(51) Int. Cl.
*H01L 29/84* (2006.01)
*H03H 3/007* (2006.01)
*H03H 9/24* (2006.01)
*H03H 9/02* (2006.01)

(52) U.S. Cl.
CPC .......... *H03H 3/0076* (2013.01); *H03H 9/2436* (2013.01); *H03H 2009/02503* (2013.01); *H03H 2009/2442* (2013.01)
USPC ................... 257/415; 257/419; 257/E29.324; 438/50

(58) Field of Classification Search
CPC ..................... H03H 3/0076; H03H 2009/2442
USPC .................. 257/414–420, E29.324, E21.519, 257/E21.305, E21.32; 333/175, 195–200, 333/212, 219, 227; 438/50
See application file for complete search history.

(56) References Cited

U.S. PATENT DOCUMENTS

| | | | |
|---|---|---|---|
| 4,719,383 A | 1/1988 | Wang et al. | |
| 6,300,706 B1 * | 10/2001 | Grudkowski et al. | 310/334 |
| 6,835,587 B2 * | 12/2004 | Kubena et al. | 438/48 |
| 7,595,708 B2 * | 9/2009 | Lutz et al. | 333/186 |
| 7,923,790 B1 * | 4/2011 | Quevy et al. | 257/415 |
| 8,058,769 B2 * | 11/2011 | Chen et al. | 310/313 R |
| 2007/0024158 A1 * | 2/2007 | Bourgeois | 310/321 |
| 2008/0223285 A1 * | 9/2008 | Lee | 117/2 |
| 2010/0001621 A1 * | 1/2010 | Yamada | 310/365 |
| 2010/0289096 A1 * | 11/2010 | Casset et al. | 257/415 |

OTHER PUBLICATIONS

Bourgeois, C et al: "Design of Resonators for the Determination of the Temperature Coefficients of Elastic Constants of Monocrystalline Silicon", 1997 IEEE International Frequency Control Symposium, pp. 791-799.
Samarao A. et al: "Temperature Compensation of Silicon Micromechanical Resonators via Degenerate Doping", 2009 IEEE International, pp. 33.2.1-33.2.4.
Koskenvuori M. et al: "Temperature Measurement and Compensation Based on Two Vibrating Modes of a Bulk Acoustic Mode Microresonator", 2008, MEMS, Jan. 13-17, 2008, pp. 78-81.

* cited by examiner

*Primary Examiner* — Cuong Q Nguyen
*Assistant Examiner* — Yosef Gebreyesus
(74) *Attorney, Agent, or Firm* — Young & Thompson

(57) ABSTRACT

The invention relates to temperature compensated micro-electro-mechanical (MEMS) resonators (300) preferably made of silicon. Prior art MEMS resonators have a significant temperature coefficient of resonance frequency, whereby it is difficult to achieve a sufficiently good frequency stability. The inventive MEMS resonator has a resonance plate (310) which resonates in Lamé mode. The resonance plate is p+ doped material, such as silicon doped with boron, and the concentration of the p+ doping is such that the plate has a temperature coefficient of resonance frequency near to zero. The tensile stress and the second order temperature coefficient can further be reduced by doping the plate with germanium.

14 Claims, 8 Drawing Sheets

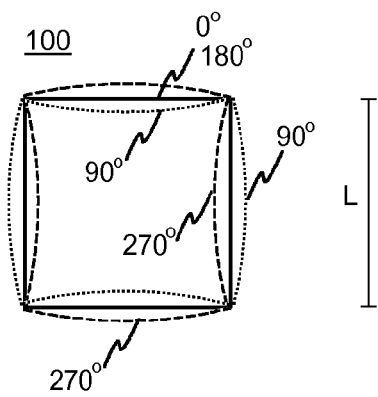
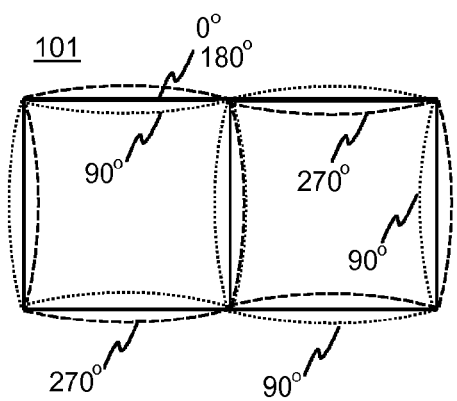
FIG. 1a  FIG. 1b
FIG. 1c  FIG. 1d
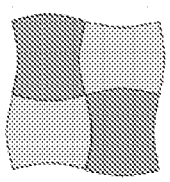
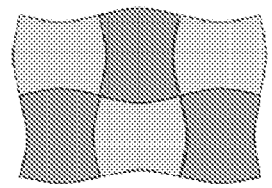
FIG. 1e  FIG. 1f  FIG. 1g  FIG. 1h
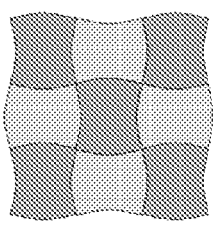
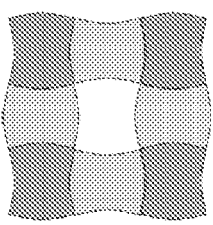
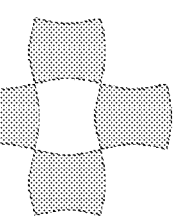
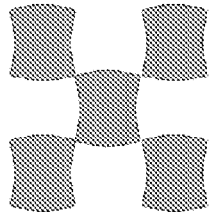
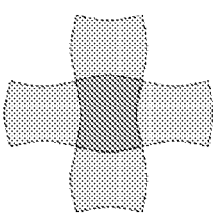
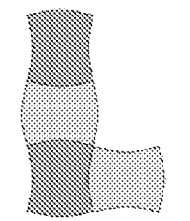
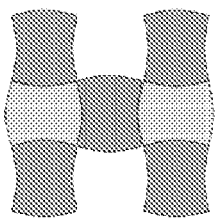
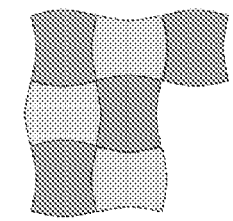
FIG. 1j  FIG. 1k  FIG. 1m  FIG. 1n

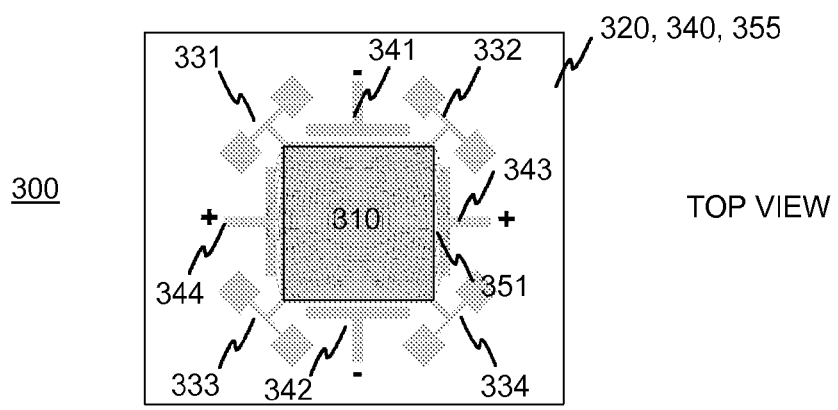
FIG. 3a
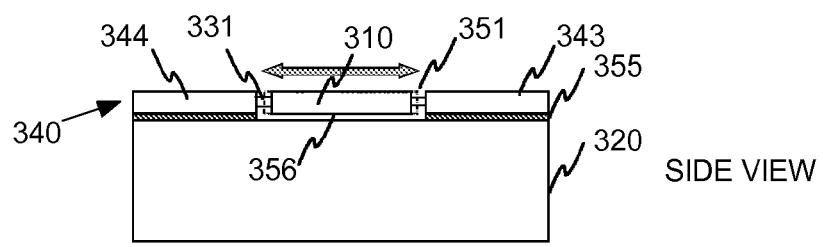
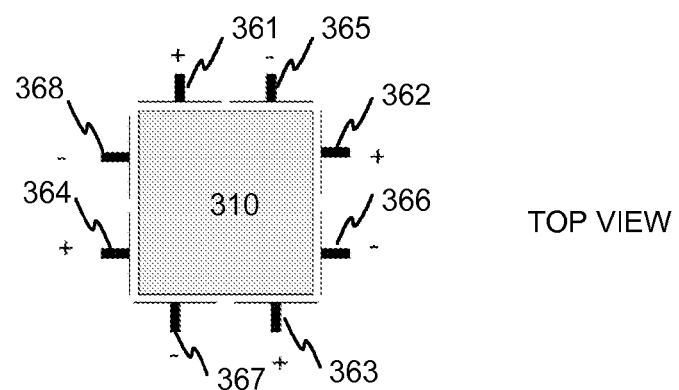
FIG. 3b

MICROELECTROMECHANICAL RESONATOR AND A METHOD FOR PRODUCING THE SAME

TECHNICAL FIELD

The invention relates to a micromechanical resonator and a method for producing the same. More specifically, the invention relates to temperature compensated micro-electro-mechanical (MEMS) resonators preferably made of silicon substrate.

BACKGROUND TECHNOLOGY

Resonators are commonly used in electronics for providing a signal with accurate and stable frequency. The resonators are mostly made using quartz crystals, which have a good accuracy and temperature stability of frequency. However, the production process for producing crystal resonators is different from the process of producing most other electrical circuits, which are mainly produced of silicon. Therefore, the quartz crystal resonators are usually separate components, whereby separate phases are required in the production process of electronic devices. The quartz crystal components also tend to be large in size.

It would be desirable to provide MEMS resonators made of silicon in order to facilitate integration with other silicon based components. However, silicon based resonators have a disadvantage of high temperature drift of the resonance frequency. The drift is due to the temperature dependence of the Young modulus of silicon, which causes a temperature coefficient of approx. −30 ppm/C. This causes the resonance frequency to fluctuate due to changes in ambient temperature.

It is possible to compensate the temperature dependence with a temperature sensor and related electronic control circuitry, but it has not been possible to provide a resonator with sufficiently low temperature drift with low cost technology which would be suitable for mass production applications. Also, the use of a temperature compensation circuit increases the consumption of energy, which is a significant disadvantage especially in battery operated devices. Further, the compensation circuit tends to increase electric noise in the resonator circuit. It is also possible to stabilize the temperature of the resonator with temperature isolation and controlled warming/cooling of the resonator. However, this solution also increases the energy consumption of the device, and makes the device complicated to produce. The temperature compensation circuits are also slow in controlling, and cannot therefore compensate fast or large changes in ambient temperature sufficiently well.

It has also been suggested to use composite structures in resonators where there are layers with opposite temperature coefficients. Document U.S. Pat. No. 4,719,383 [1] discloses a shear wave resonator structure wherein a resonating beam has a piezoelectric layer and a p+ doped silicon layer. While the piezoelectric layer has a negative temperature coefficient, a heavily p+ doped silicon layer has a positive temperature coefficient. The thicknesses of the piezoelectric and doped silicon layers are made such that the total temperature coefficient of the resonator is near to zero.

There are certain disadvantages related with resonators of such composite structure as well. Firstly, the p+ doping of document [1] is made by diffusion via the material surface. Diffusion is typically a slow process, and therefore the doped layer cannot be very thick. Increasing the thickness of the silicon layer would also cause the coupling of the actuation to be worse. As a result, since the resonance frequency is a function of the total thickness of the resonator structure it is only possible to provide resonators with high frequencies. The patent document mentions suitable frequencies above 300 MHz. However, there are numerous applications where lower resonance frequencies are required, for example in the range of 10-40 MHz. The solution of document [1] is not feasible for such lower resonance frequencies.

Another problem relating to the composite structure of document [1] relates to the accuracy of the resonance frequency. In a thickness oriented shear wave resonator the resonance frequency is determined by the thickness of the resonator structure, and therefore an accurate resonance frequency requires achieving an accurate thickness of the beam structure. However, it appears very difficult to achieve sufficient accuracy of the thickness, and therefore it is difficult to achieve the required accuracy of resonance frequency. In mass production, the deviation of resonance frequencies of such resonators tend to be high, and thus the yield of resonators which fulfil the required specifications tends to become low.

A further problem which relates to the prior art MEMS resonators is the fact that the small-size resonator beam has a small oscillating mass, and therefore the resonator is able to store only a small amount of oscillation energy. This in turn causes a low signal-to-noise ratio of the resonator and thus instability of the output signal frequency.

A still further problem is related to actuation of the beam resonator where the beam oscillates in a thickness oriented shear wave mode. When piezoelectric actuation is used the c-axis of the piezoelectric layer must be inclined in order to provide actuation of the correct direction for the shear wave by using an electrical actuation field which is perpendicular to the plane of the dielectric layer. However, it requires special production technology to achieve a piezoelectric layer with inclined c-axis, and such a special technology is not commonly used in the production of microelectronics.

SUMMARY OF THE INVENTION

The purpose of the present invention is to avoid or reduce the above disadvantages of the prior art.

The object of the invention is achieved with a solution, in which a resonance plate made of p+ doped silicon material oscillates in Lamé mode resonance. The temperature coefficient of the resonator is compensated by a suitable concentration of p+ dopant such as boron. The Lamé mode resonance oscillation is based on shear waves, and the resonance frequency has such a dependency on elastic constants that the temperature coefficient of which can be compensated with p+ doping in a relatively accurate manner. With this inventive solution it is possible to avoid or reduce the above mentioned problems related with the prior art.

A micro-electro-mechanical (MEMS) resonator according to the invention is characterised by comprising a substrate and a plate which is anchored to the substrate and which is arranged to resonate in a Lamé mode, whereby the material of the plate is p+ doped in such a quantity that the temperature coefficient of the resonance frequency of the plate is close to zero.

A method according to the invention for producing a micro-electro-mechanical (MEMS) resonator is characterised in that
 a substrate is provided,
 a plate of p+ doped material is provided, whereby the plate is made into a form which facilitates Lamé mode resonance, providing at least one anchor between the substrate and the plate, and providing actuating means for actuating Lamé mode resonance, whereby the p+ doping has such a concentration that the temperature coefficient of the Lamé mode resonance frequency is near to zero.

Some preferable embodiments of the invention are described in the dependent claims.

According to a preferable embodiment the plate is silicon which is heavily boron doped. The plate material may also be doped with germanium in order to reduce tensile stress which is caused by the p+ doping. There may also be other alternative methods for the reduction of the tensile stress. The inventors of the present patent application have discovered that the doping with germanium also has an effect of reducing the second order temperature coefficient of the material compared to material with merely Boron doping. This can be a significant feature in order to achieve accurate temperature compensation within a large temperature range.

It should be noted that in addition to the basic silicon material of the plate, the resonator may include also other structures which may have a negative temperature coefficient. They may include a electrode structure or a piezoelectric layer, for example. Therefore, it is preferable to obtain by doping and possible other means such compensation to the temperature coefficient of the resonator plate that the total temperature coefficient of the resonance frequency of the resonator is close to zero. This may mean that the temperature coefficient of a separate resonator plate without other resonator structures would be slightly positive.

According to one embodiment the plate has a layer of silicon dioxide. A silicon dioxide layer has a positive temperature coefficient, whereby it is possible increase the absolute value of the temperature coefficient of the resonance plate if the effect of the p+ doping is not sufficient for any reason. For example, the negative temperature coefficient of the electrodes, piezoelectric layer or other structures can be compensated with the silicon dioxide layer.

In one embodiment of the invention the resonator is capacitively actuated by applying electrodes near to the sides of the resonator plate. The actuating signal is applied in the electrode pairs in such a way that the electrodes of opposite sides have the same potential. When the resonator is actuated capacitively it is not necessary to have any other material, such as piezoelectric material, attached to the resonator plate due to actuation.

However, according to another embodiment the resonator plate has a layer of piezoelectric material for the actuation, instead of the capacitive actuation. In this case it is possible to use a piezoelectric layer which has its c-axis perpendicular to the layer plane. Therefore, a standard technology can be used for producing the piezoelectric layer.

Significant advantages can be achieved with the present invention when compared to the prior known solutions. Firstly, the inventive resonator has the general advantages of MEMS resonators, such as a smaller size compared to quartz crystal resonators. Resonators can be produced with the same production technology as other integrated components in electronic circuits, and the production phases can thus be reduced and simplified. Especially, it is possible to produce the resonators with Silicon On Insulator (SOI) process or with Cavity-SOI (CSOI) process wherein the cavities are pre-etched.

In the inventive resonators it is also possible to achieve a very low temperature drift of resonance frequency, whereby the resonators according to the invention can be used in most applications where quartz crystal resonators have been used earlier. In the solution according to the invention it is possible to achieve a sufficiently low temperature drift without using active temperature compensation circuits, and therefore low energy consumption can be achieved.

The frequency of the inventive resonator is determined by the side length L of the resonating square. The form and size of the resonating plate can be defined with lithography, and therefore the dimensions can be made very accurate. Therefore, the resonating frequency can also be made very accurate. Since the resonating frequency is determined by the side length of the resonating square, it is possible to produce low frequency resonators and a still have a small thickness of the resonating plate.

In a shear wave resonating plate of square form the vibrating mass is relatively large, whereby the resonator can provide a high signal-to-noise value. Frequency instability due to frequency noise is therefore small.

SHORT DESCRIPTION OF THE DRAWINGS

In the following part the preferable exemplary embodiments of the invention are described in more detail by referring to the enclosed drawings, in which:

FIG. 1a illustrates Lamé mode resonance in a resonance plate of square form;

FIG. 1b illustrates Lamé mode resonance in a resonance plate with a form of two adjacent sub squares;

Figure 2A:
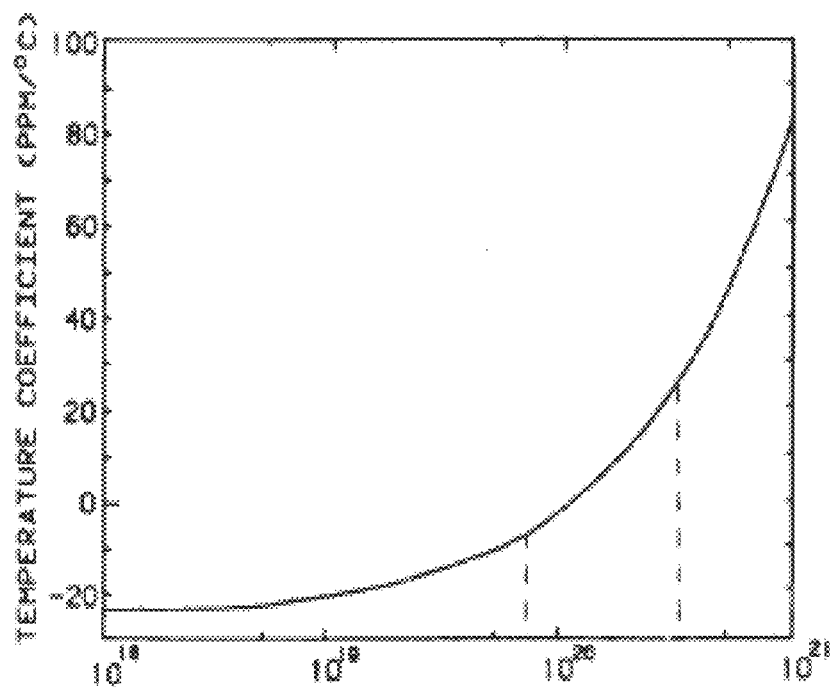
Figure 2B:
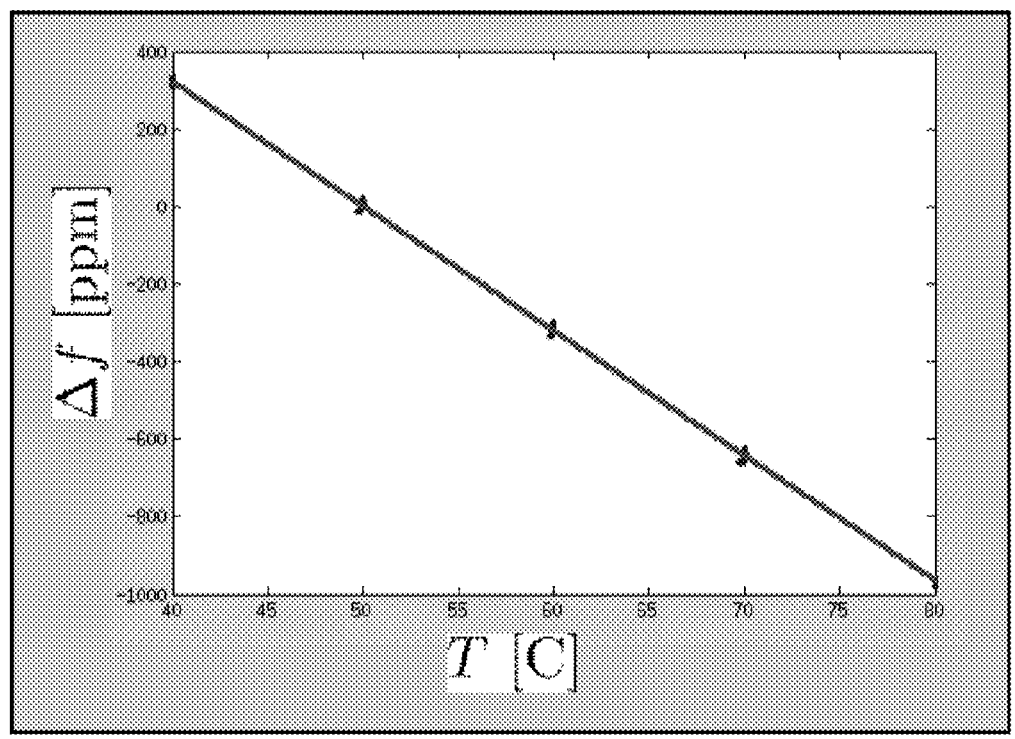
Figure 2C:
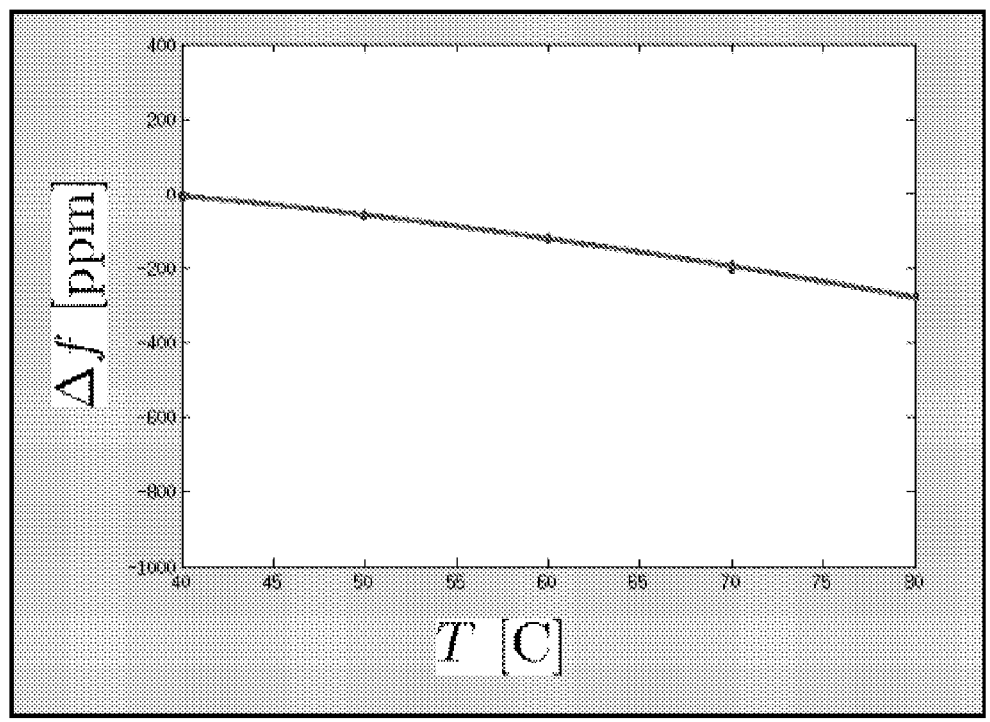
Figure 2D:
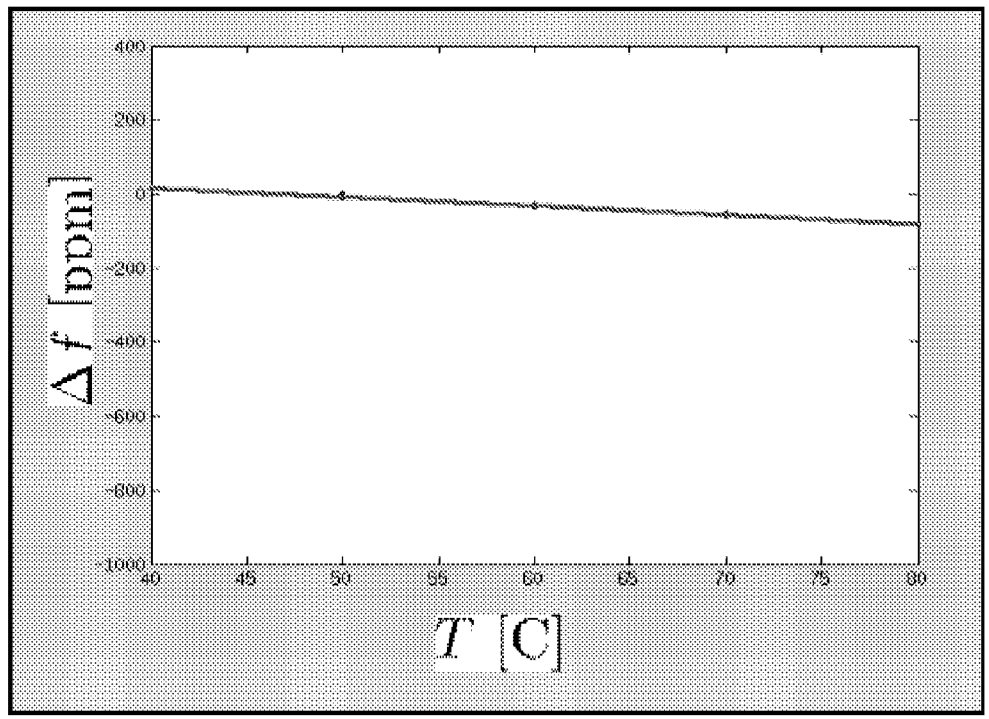
Figure 4A:
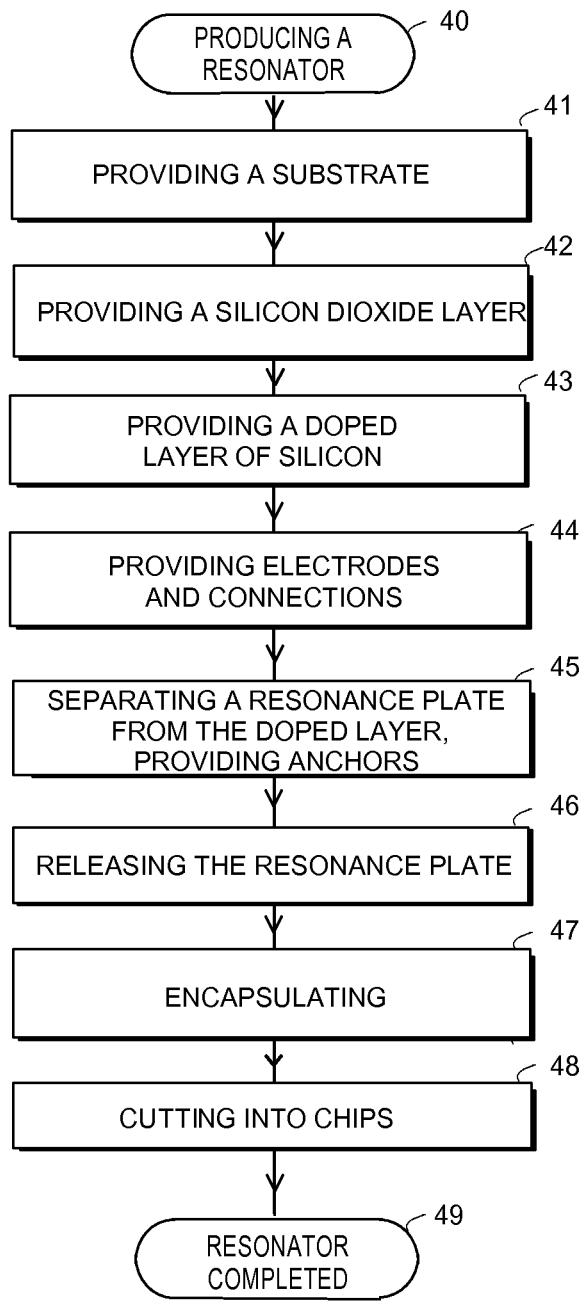
Figure 4B:
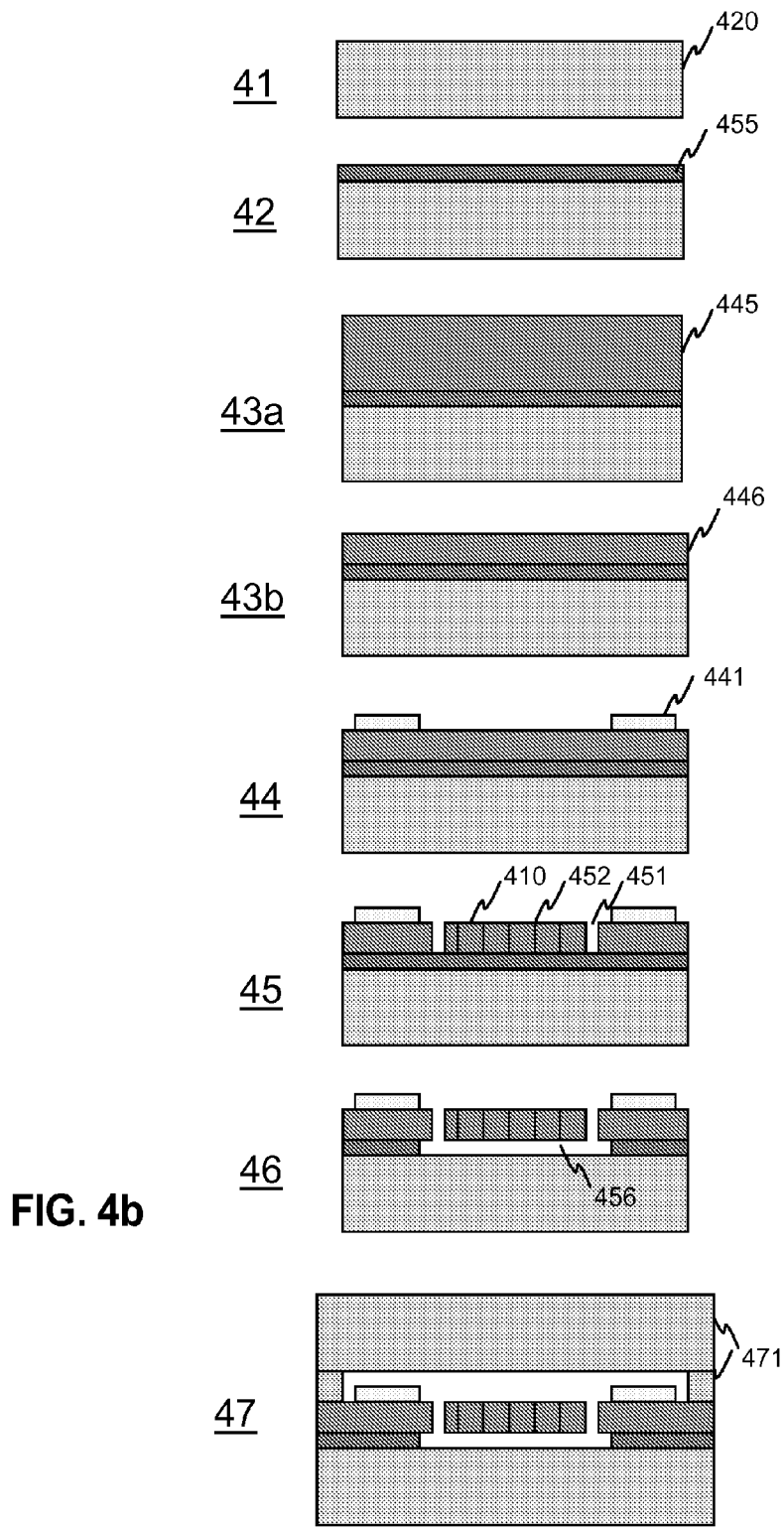
Figure 5A:
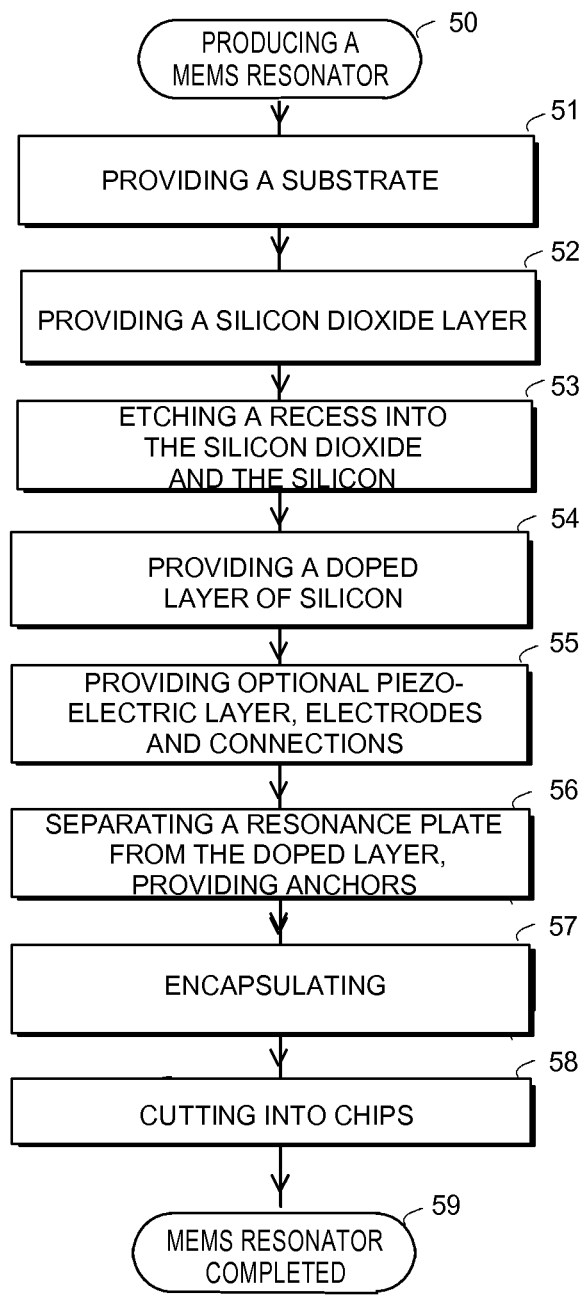
Figure 5B:
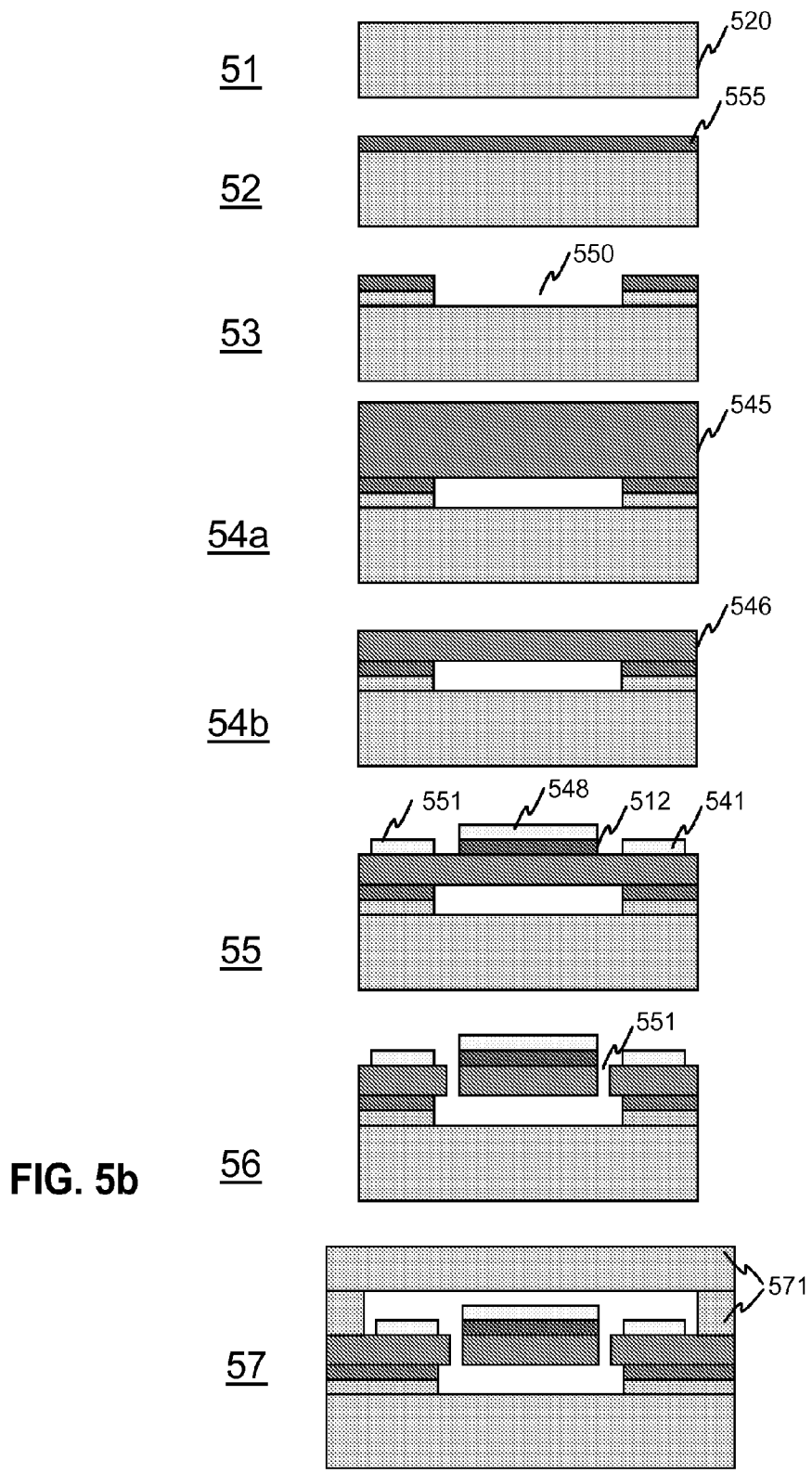

FIGS. 1c-1h, 1j, 1k, 1m, and 1n illustrate harmonic resonance modes in resonance plates which are formed of sub squares;

FIG. 2a illustrates a theoretical graph from prior art literature which shows the temperature coefficient of doped silicon as a function of Boron doping concentration;

FIG. 2b illustrates a graph which shows measurement results of the applicant for the resonance frequency change as a function of temperature in a resonator plate with standard Boron doping concentration;

FIG. 2c illustrates a graph which shows measurement results of the applicant for the resonance frequency change as a function of temperature in a resonator plate with heavy boron doping concentration;

FIG. 2d illustrates a graph which shows measurement results of the applicant for the resonance frequency change as a function of temperature in a resonator plate with heavy boron doping concentration together with germanium doping;

FIG. 3a illustrates a top view and a cross section side view of an exemplary MEMS resonator according to the invention where capacitive actuation is used;

FIG. 3b illustrates a top view of an exemplary MEMS resonance plate which is actuated into a second harmonic resonance frequency;

FIG. 4a illustrates a flow diagram of an exemplary process according to the invention for producing a MEMS resonator;

FIG. 4b illustrates cross section views of the product after the production process phases of FIG. 4a;

FIG. 5a illustrates a flow diagram of another exemplary process according to the invention for producing a MEMS resonator; and FIG. 5b illustrates cross section views of the product after the production process phases of FIG. 5a.

DETAILED DESCRIPTION OF THE EMBODIMENTS

FIG. 1a illustrates Lamé mode resonance in a resonance plate 100, which has a form of a square with nominal length L of each side. The phase in which the sides of the plate are in a rest position is cited 0° and 180°, and shown as uniform lines. In the oscillation phase of 90° the vertical shown sides are convex, and the horizontal shown sides are concave. In the oscillation phase 270° the sides shown vertical are concave and the sides shown horizontal are convex. The sides of the plate in oscillation phases 90° and 270° are shown with dash lines. The resonance plate maintains its volume in the Lamé resonance mode in all instants of oscillation.

The Lamé mode is a combination of two shear waves, and it is known to exist in several crystal orientations of silicon. Resonance frequencies f of two modes in Si 001 wafers are determined by following equations:

$$f = \frac{1}{\sqrt{2}L}\sqrt{\frac{c_{44}}{\rho}} \quad (A)$$

$$f = \frac{1}{2L}\sqrt{\frac{c_{11}-c_{12}}{\rho}} \quad (B)$$

where L stands for length of the side of the square, $c_{11}$, $c_{12}$ and $c_{44}$ are elastic constants, and $\rho$ stands for density of the wafer material. In the resonance mode of equation (A) the side of the square may have crystal orientation <110>, which can be obtained by using (001) oriented silicon wafer, or in a (110) oriented silicon wafer one plate diagonal is oriented along <110> direction and the other plate diagonal is oriented along <100> direction. In the resonance mode of equation (B) the side of the square has crystal orientation <100>, which can be obtained by using (001) silicon wafer. The temperature dependence of the resonance frequency is mainly due to temperature dependence of the Young's modulus, i.e. elastic constants. Equation (B) further shows that the temperature dependence of the mode frequency is determined only by shear wave characteristics ($c_{44}$). It has been shown theoretically and experimentally that the temperature coefficient of the elastic constants ($c_{11}$-$c_{12}$) and $c_{44}$ of silicon can be increased by p+ doping (i.e. the absolute value of the originally negative temperature coefficient can be decreased).

In addition to the above two fundamental Lamé-modes, it is possible to use a resonance plate that has been made up of two or several of these basic plate elements. In this case, the resonance frequency is equal to the frequency of the basic element given by the formulas above. This covers the higher harmonics of a single plate as one can consider the plate to be divided into smaller squares. Any regular square, rectangular and irregular combinations of these can be used.

FIG. 1b illustrates Lamé mode resonance in another resonance plate 101, which has a form of a two adjacent squares with nominal length L of each side. The lengths of the resonator sides are thus L and 2L. The adjacent squares of the resonator plate oscillate in opposite phases as is illustrated by FIG. 1b. The frequency is defined by the above formula (A) or (B), wherein L is the side length of a sub square.

FIGS. 1c-1h, 1j, 1k, 1m, and 1n illustrate other examples of plate geometries which consist of several sub squares. FIG. 1c illustrates a square plate which comprises 2×2 resonating sub squares. FIG. 1d illustrates a rectangular plate which includes 2×3 sub squares. FIG. 1e illustrates a square plate which comprises 3×3 sub squares. It is also possible that a plate geometry does not include plate material in all sub squares, as is illustrated in FIG. 1f. In this case the plate does not include material in the middle sub square. FIGS. 1g, 1h, 1j, 1m and 1n illustrate other examples wherein the plate does not include plate material in some sub squares of the plate. FIG. 1k illustrates an example of a 3×2 size resonance of L-shape.

FIG. 2a illustrates a prior known graph from [Wang, J. S.; Lakin, K. M.; Landin, A. R.; "Sputtered C-Axis Inclined Piezoelectric Films and Shear Wave Resonators," 37th Annual Symposium on Frequency Control. 1983, pp. 144-150, 1983], which shows temperature coefficient of shear wave resonance frequency for silicon as a function of boron doping concentration. The graph shows that with moderate doping, i.e. concentration of <$10^{19}$ cm$^{-3}$, the temperature coefficient is approximately −20 ppm/° C. Such a doping concentration is commonly used in p+ doped silicon in order to achieve semiconductor properties. With doping concentration of $10^{19}$ cm$^{-3}$ ... 3*$10^{20}$ cm$^{-3}$ the temperature coefficient is near to zero. With higher doping concentrations the temperature coefficient is positive. The optimal doping concentration value of the resonating plate in the inventive structure is in the range 5*$10^{19}$ cm$^{-3}$ ... 2*$10^{20}$ cm$^{-3}$.

The doping of silicon with boron causes increased tensile stress within the material. This phenomenon can be preferably compensated by doping the material additionally with germanium. The doping with germanium also has an effect of reducing the second order temperature coefficient of the material compared to material with merely Boron doping. This is an important feature in order to achieve accurate temperature compensation within a large temperature range. The doping with germanium can be made e.g. simultaneously with p+ doping, or with a separate process.

FIGS. 2b, 2c and 2d illustrate graphs showing test results of the applicant for temperature dependency of the resonance frequency (ppm) in a Lamé mode resonator. FIG. 2b illustrates the frequency change as a function of the temperature in a resonator where a standard Boron doping is used in the resonator plate. The value of the standard doping concentration was less than $10^{18}$ cm$^{-3}$ in this test. FIG. 2c illustrates the frequency change as a function of the temperature in a resonator where a heavy Boron doping is used in the resonator plate. The value of the doping concentration was higher than $10^{19}$ cm$^{-3}$ in this test. FIG. 2d illustrates the frequency change as a function of the temperature in a resonator where a heavy Boron doping and additional germanium doping is used in the resonator plate. The value of the boron doping concentration was higher than $10^{20}$ cm$^{-3}$ in this test. The graphs clearly show that it is possible to achieve a near-zero temperature coefficient of the resonance frequency by using heavy boron doping preferably with germanium doping. The near to zero temperature coefficient of the resonance frequency means in this patent application absolute values of <30 ppm/° C., preferably <10 ppm/° C., more preferably <5 ppm/° C., and most preferably <3 ppm/° C. The absolute value of <30 ppm/° C. means the temperature coefficient is better than with an uncompensated resonator. The absolute value of <3 ppm/° C. on the other hand means that the temperature coefficient is good enough for most applications where stable frequency is required.

FIG. 3a illustrates a top view and a cross section side view of an exemplary MEMS resonator 300 according to the invention. The resonator has a resonance plate 310 of square form, which is thus capable for Lamé mode resonance. The resonance plate is attached to a substrate with anchors 331-334 at the corners of the resonance plate. The anchors may locate in other oscillation nodes instead or in addition to the corners of the resonance plate. The substrate has a base 320 of standard silicon, for example, and an upper layer 340 is silicon which is heavily doped with boron or some other p+ dopant of the boron group of elements. The upper layer is preferably also doped with germanium in order to reduce the tensile stress caused by the p+ doping, and in order to reduce second order temperature coefficient of the plate material. The resonance plate is formed from the upper, p+ doped layer in order to achieve a near-zero temperature coefficient of the resonance frequency.

Between the upper and lower silicon layers there is an electrically isolating layer 355 of silicon dioxide. The silicon dioxide layer has been removed from between the resonance plate and the substrate, 356, in order to release the plate for oscillation. The resonance plate may have small holes used for etching the sacrificial layer of silicon dioxide. There are also gaps 351 between the sides of the resonance plate and the remaining upper silicon layer.

The resonance plate 310 is capacitively actuated into a Lamé resonance mode of oscillation. There are electrodes 341 and 342 connected to a first actuating signal potential, and electrodes 343 and 344 connected to an opposite actuating potential. The resonance plate is electrically conductive, and the alternating actuation signal thus actuates an oscillation of Lamé mode in the resonance plate. It is preferable that the gap between the electrodes and the resonance plate is small, such as less than 200 nm, in order to achieve good coupling for the actuation. The electrodes can be provided by patterning the upper silicon layer, which is electrically conductive due to the p+ doping. It should be noted that instead of four electrodes it is also possible to use only two electrodes for the actuation.

It is also possible to provide the resonator with only upper substrate layer 340, without lower substrate layer 320 and insulating layer 355. In this case, the substrate is preferably attached to some other support base.

As an alternative to capacitive actuation it is possible to use piezoelectric actuation. In this case the resonance plate has a further layer of piezoelectric material, and electrode layers above and under the piezoelectric layer.

FIG. 3b illustrates exemplary actuation of a resonance plate 310 wherein square the plate has four virtual sub squares as shown in FIG. 1c, and it is actuated for the second harmonic resonance. In this case each side has two electrodes with opposite actuation phases. Electrodes 361-364 are thus connected to a first actuation potential, and electrodes 365-368 are connected to a second actuation potential. However, is should be noted that the actuation is possible even with a smaller number of electrodes.

FIG. 4a illustrates a flow diagram of an exemplary method according to the invention for producing a Lamé mode MEMS resonator, 40. FIG. 4b illustrates cross section views of a product after the process phases of FIG. 4a. The Figures of the product have a citation to the phase number of the corresponding process. The production process is started by producing a substrate 420 in phase 41. The substrate material can be e.g. standard silicon wafer. Next in phase 42 a sacrificial layer 455 is formed on the substrate. The sacrificial layer will determine the distance 456 between the substrate and the resonating plate. The sacrificial layer can be silicon dioxide, for example. This layer 455 of silicon dioxide is also needed for creating a bond between the silicon layers.

In phase 43 a doped layer 446 of silicon is deposited on the sacrificial layer. This layer will form the resonating plate of the resonator. The layer is preferably p+ doped with boron or some other element of the boron group. It is also preferable to additionally use doping with germanium in order to reduce the tensile stress caused by the p+ doping, and in order to reduce second order temperature coefficient of the plate material. The doped layer can be provided e.g. by first depositing a layer of silicon, then doping the silicon layer with boron by diffusion, and finally doping the layer with germanium by diffusion. Alternatively, it is possible to provide simultaneous doping with both p+ doping element and germanium. It is also possible to provide the doping during the growth process of the silicon layer.

FIG. 4b shows a further possibility where a wafer 445 of doped silicon is first attached to the substrate, 43a, and the wafer is then thinned into a suitable thickness 446, such as 10-50 μm, 43b. Instead of using a heavily pre-doped layer in phase 43 it is possible to use a non-doped or less heavily doped layer, and to reach the final doping concentration by applying doping by e.g. diffusion or ion implantation after the step 43.

It is also possible to use SOI (Silicon On Insulator) process, wherein a silicon wafer is grown which will have a silicon base, insulation layer and a further layer of silicon.

The electrodes and the electrical connections to the electrodes 441 can be made by e.g. depositing aluminium, phase 44. The electrodes are located e.g. at the gaps of opposite sides of the plate. The distance between the electrode and the plate is preferably less than 200 nm. As an alternative to the capacitive actuation it is also possible to use piezoelectric actuation. In this case, a layer of piezoelectric material is deposited on the resonator plate, and electrode layers are formed above and under the piezoelectric layer for actuation In phase 45 the resonance plate 410 is separated from the doped silicon layer by patterning and etching in order to make a gap 451 around the plate. The etching is preferably vertical high aspect ratio etching into the doped silicon layer. The plate is given such a form that the plate facilitates Lamé mode resonance. The form of the plate is preferably square, but the form may also include two or several adjacent squares. The plate will remain attached to the surrounding doped silicon layer with anchors which are preferably located at the corners of the plate. The anchors are formed by patterning the doped silicon layer in such a way that the anchors remain not etched. If necessary, it is also possible to provide holes 452 into the resonator plate in phase 45 for the followed etching of the sacrificial layer.

In phase 46 the resonance layer is released from the substrate by removing the sacrificial layer from between the substrate and the plate 456. The removal is preferably provided by etching with e.g. HF or HF vapour. The etching can be made via the gaps 451 around the plate, or if the plate was provided with small through-holes 452 in phase 45, the etching of the sacrificial layer can also be made through such holes.

In one embodiment a layer of silicon dioxide is deposited on the resonance plate. A silicon dioxide layer has a positive temperature coefficient, whereby it is possible increase the absolute value of the temperature coefficient of the resonance plate if the effect of the p+ doping is not sufficient. For example, the negative temperature coefficient of the electrodes, piezoelectric layer or other structures can be compensated with the silicon dioxide layer.

One MEMS component may naturally include other circuits in addition to the resonator. Also one substrate wafer may include chips of several components. The wafer is encapsulated 471 in phase 47, and separated by cutting, phase 48. As an alternative to this wafer level encapsulation it is also possible to use chip level encapsulation where the wafer is first cut into chips, and the chips are then encapsulated.

FIG. 5a illustrates a flow diagram of another exemplary method according to the invention for producing a Lamé mode MEMS resonator, 50. FIG. 5b illustrates cross section views of the product under production after the process phases of FIG. 5a. The Figures of the product have a citation to the phase number of the corresponding process. In the process of FIG. 5a, 5b CSOI (pre-etched Cavity Silicon On Insulator) process is used.

The production process is started by producing a substrate 520 in phase 51. The substrate material can be e.g. standard silicon wafer. Next in phase 52 a sacrificial layer 555 is formed on the substrate. The sacrificial layer together with an etched recess into the silicon substrate determines the distance between the substrate and the resonating plate. The sacrificial layer can be silicon dioxide, for example. This layer of silicon dioxide is also needed for creating a bond between the silicon layers.

In phase 53 a recess 550 is etched to the silicon dioxide layer and the silicon substrate. The recess is made for providing a distance between the resonance plate and the substrate.

In phase 54 doped layer of silicon is deposited on the sacrificial layer. This layer will form the resonating plate of the resonator. The layer is preferably p+ doped with boron or some other element of the boron group. It is also preferable to additionally use doping with germanium in order to reduce the tensile stress caused by the p+ doping, and in order to reduce second order temperature coefficient of the plate material. The doped layer can be provided e.g. by first depositing a layer of silicon, then doping the silicon layer with boron by diffusion, and finally doping the layer with germanium by diffusion. Alternatively, it is possible to provide simultaneous doping with both p+ doping element and germanium. It is also possible to provide the doping during the growth process of the silicon layer.

FIG. 5b shows a further possibility where a wafer 545 of doped silicon is first attached to the substrate, 54a, and the wafer is then thinned into a suitable thickness 546, such as 10-50 μm, 54b. Instead of using a heavily pre-doped layer in phase 54 it is possible to use a non-doped or less heavily doped layer, and to reach the final doping concentration by applying doping by e.g. diffusion or ion implantation after the step 54.

The electrodes and the electrical connections to the electrodes 541 can be made by e.g. depositing aluminium, phase 55. The electrodes are located e.g. at the gaps of opposite sides of the plate. The distance between the electrode and the plate is preferably less than 200 nm. As an alternative to the capacitive actuation it is also possible to use piezoelectric actuation. In this case, a layer of piezoelectric material is deposited on the resonator plate, and electrode layers are formed above and/or under the piezoelectric layer for actuation. FIG. 5b shows a piezoelectric layer 512 and electrode layer 548 above the piezoelectric layer.

In phase 56 the resonance plate is separated from the doped silicon layer by patterning and etching in order to make a gap 551 around the plate. The etching is preferably vertical high aspect ratio etching into the doped silicon layer. The plate is given such a form that the plate facilitates Lamé mode resonance. The form of the plate is preferably square, but the form may also include two or several adjacent squares. The plate will remain attached to the surrounding doped silicon layer with anchors which are preferably located at the corners of the plate. The anchors are formed by patterning the doped silicon layer in such a way that the anchors remain not etched.

In one embodiment a layer of silicon dioxide is deposited on the resonance plate. A silicon dioxide layer has a positive temperature coefficient, whereby it is possible increase the absolute value of the temperature coefficient of the resonance plate if the effect of the p+ doping is not sufficient. For example, the negative temperature coefficient of the electrodes, piezoelectric layer or other structures can be compensated with the silicon dioxide layer.

One MEMS component may naturally include other circuits in addition to the resonator. Also one substrate wafer may include chips of several components. The wafer is encapsulated 571 in phase 57, and separated by cutting, phase 58. As an alternative to this wafer level encapsulation it is also possible to use chip level encapsulation where the wafer is first cut into chips, and the chips are then encapsulated.

The invention has been described with the reference to the enclosed embodiments. It is, however, clear that the invention is not restricted only to those, but it comprises all embodiments which can be imagined within the inventive idea and the enclosed patent claims.

For example, some materials and dimensions have been mentioned as examples for implementation of the invention. However, it is clear that dimensions and materials as well as details of structure or phases of production can be changed and optimised for each implementation according to the specific requirements.

Above, the use of boron was described as a preferable doping element. However, it must be noted that it is quite possible to use other alternatives, such as gallium, aluminium, or indium as well as a combination of the mentioned elements. Also, germanium has been mentioned as a preferable doping element for the compensation of tensile stress of silicon crystal. However, it is also possible to use some other doping element for the compensation of the tensile stress. Similarly, it may be possible to use some other doping element than germanium for reducing second order temperature coefficient of the plate material.

The inventive resonators have several preferable applications in various electronic devices. They can be used in various types of oscillators and timers of information and communication technology, measurement devices or control devices, for example.

The invention claimed is:

1. Micro-electro-mechanical (MEMS) resonator comprising:
   a substrate; and
   a resonator plate which is anchored to the substrate and which is arranged to resonate in a Lamé mode,
   wherein the resonator plate is comprised of a material p+ doped in such a quantity that the temperature coefficient of the resonance frequency of the plate is close to zero,
   wherein the resonator plate material is p+ doped with an element of boron group of the periodic table of elements, and
   wherein the p+ doping concentration in the resonator plate is between $5*10^{19}$ cm$^{-3}$ and $3*10^{20}$ cm$^{-3}$ thereby rendering the temperature coefficient of the resonance frequency of the plate close to zero.

2. MEMS resonator according to claim 1, wherein the basic form of the resonator plate is square.

3. MEMS resonator according to claim 1, wherein the basic form of the resonator plate comprises n×m squares, wherein n and m are integers.

4. MEMS resonator according to claim 1, wherein a side of the resonator plate has a crystal orientation <110>.

5. MEMS resonator according to claim 1, further comprising another of said resonator plate so as to define a first resonator plate and a second resonator plate, wherein said first resonator plate diagonal is oriented along <110> direction and said second resonator plate diagonal is oriented along <100> direction.

6. MEMS resonator according to claim 1, wherein the resonance mode is characterised by the equation $$f = \frac{1}{\sqrt{2}L}\sqrt{\frac{c_{44}}{\rho}}$$

wherein L stands for the length of the side of a square or a sub square when the resonance plate is formed of a square or sub squares, c44 is an elastic constant of the resonator plate material, ρ stands for density of the resonator plate material, and f is resonance frequency.

7. MEMS resonator according to claim 1, wherein the side of a resonator plate has a crystal orientation <100>.

8. MEMS resonator according to claim 1, characterised in that the resonance mode is characterised by the equation $$f = \frac{1}{2L}\sqrt{\frac{c_{11}-c_{12}}{\rho}}$$

wherein L stands for the length of the side of a square or a sub square when the resonance plate is formed of a square or sub squares, $c_{11}$ and $c_{12}$ are elastic constants of the resonator plate material, and ρ stands for density of the resonator plate material, and f is resonance frequency.

9. MEMS resonator according to claim 1, wherein the resonator plate material is p+ doped with boron.

10. MEMS resonator according to claim 1, wherein the resonator plate material is additionally doped with a further element for reducing the tensile stress of the resonator plate material.

11. MEMS resonator according to claim 10, wherein the further element is germanium.

12. MEMS resonator according to claim 1, wherein the resonator plate material is additionally doped with a further element for reducing the second order temperature coefficient of the resonator plate material.

13. MEMS resonator according to claim 1, wherein it comprises electrodes adjacent to the sides of the resonance plate for actuating the resonator plate to resonate in Lamé mode.

14. MEMS resonator according to claim 1, wherein the resonance plate comprises a layer of silicon dioxide for increasing the absolute value of the temperature coefficient of the resonance plate.

\* \* \* \* \*